(12) United States Patent
Takahashi

(10) Patent No.: US 6,392,822 B1
(45) Date of Patent: May 21, 2002

(54) DUAL-IMAGING OPTICAL SYSTEM

(75) Inventor: Tomowaki Takahashi, Tokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/679,267

(22) Filed: Oct. 4, 2000

Related U.S. Application Data

(63) Continuation of application No. 08/877,920, filed on Jun. 18, 1997, now Pat. No. 6,157,498.

(30) Foreign Application Priority Data

Jun. 19, 1996 (JP) .............................. 8-179881
Jun. 19, 1996 (JP) .............................. 8-179882

(51) Int. Cl.$^7$ ...................... G02B 17/08; G03B 27/42
(52) U.S. Cl. .................... 359/728; 359/364; 359/727
(58) Field of Search ...................... 359/365–367, 359/726–732, 708, 856–860; 355/52–69

(56) References Cited

U.S. PATENT DOCUMENTS

| | | | |
|---|---|---|---|
| 4,367,010 A | 1/1983 | Broome ................. 359/708 |
| 4,685,777 A | * 8/1987 | Hirose ................. 359/366 |
| 4,779,966 A | 10/1988 | Friedman ............. 359/730 |
| 4,906,078 A | 3/1990 | Inabata et al. ........ 359/708 |
| 4,971,428 A | * 11/1990 | Moskovich ........... 359/366 |
| 5,031,976 A | 7/1991 | Shafer ................. 359/355 |
| 5,153,772 A | 10/1992 | Kathman et al. ..... 359/365 |
| 5,212,593 A | 5/1993 | Williamson et al. . 359/728 |
| 5,287,218 A | 2/1994 | Chen .................... 359/365 |
| 5,323,263 A | 6/1994 | Schoemakers ........ 359/365 |
| 5,668,673 A | * 9/1997 | Suenaga et al. ...... 359/727 |
| 5,691,802 A | * 11/1997 | Takahashi ............ 359/727 |
| 5,694,241 A | 12/1997 | Ishiyama et al. ..... 359/364 |
| 5,805,334 A | 9/1998 | Takahashi ............ 359/784 |
| 6,157,498 A | * 12/2000 | Takahashi ............ 359/365 |

* cited by examiner

*Primary Examiner*—Thong Nguyen
(74) *Attorney, Agent, or Firm*—Klarquist Sparkman, LLP

(57) ABSTRACT

An optical imaging system especially for microlithography includes a first imaging system forming an intermediate image of an object, and a second imaging system forming, on a surface, an image of the intermediate image. A reflective surface directs light from the first imaging system to the second imaging system. An aspherical corrective optical surface is located at or near the location of the intermediate image for correcting aberrations such as high-order distortion, aberrations due to accumulation of manufacturing tolerances, and spherical aberration. The first imaging system comprises a positive power refractive element and a concave mirror. The second imaging system comprises refractive elements and no concave mirror.

32 Claims, 7 Drawing Sheets

DUAL-IMAGING OPTICAL SYSTEM

CROSS REFERENCE TO RELATED APPLICATIONS

This application is a continuation of allowed application Ser. No. 08/877,920, filed Jun. 18, 1997, now U.S. Pat. No. 6,157,498, that is incorporated herein by reference.

FIELD OF THE INVENTION

This invention pertains primarily to optical systems used in reduction-type projection-exposure apparatus such as projection steppers and scanners used in the manufacture of semiconductors. The invention is especially directed to such apparatus that employ catadioptric optical systems in their optical systems with resolution in the sub-micron levels of the ultraviolet wavelengths.

BACKGROUND OF THE INVENTION

As circuit patterns for semiconductors become finer, higher levels of resolution are demanded of steppers and scanners that expose these patterns. To satisfy demands for higher resolution, the wavelength of the radiation employed must be reduced, and the numerical aperture (NA) of the optical system must be increased.

Only a few optical materials are adequately transmissive at shorter wavelengths. For wavelengths of 300 nm or less, the only currently available materials that can be used effectively are synthetic fused silica and fluorite.

The Abbe numbers of fused silica and fluorite are not sufficiently different from each other to allow complete correction of chromatic aberration. For this reason, at wavelengths of 300 nm or below, it is extremely difficult to correct chromatic aberration in projection-optical systems comprised solely of standard refractive optical systems.

Fluorite itself suffers from certain disadvantages. The refractive index of fluorite changes relatively rapidly with variations in temperature, and fluorite polishes poorly. Thus, many optical systems do not use fluorite, resulting in systems with lenses of fused silica only. Such all-silica systems exhibit uncorrectable chromatic aberration.

Purely reflective optical systems avoid chromatic aberration, but such systems tend to be excessively large, and to require one or more aspheric reflecting surfaces. The production of (large) precision aspheric surfaces is extremely difficult.

As a result, various technologies making use of "catadioptric" optical systems (i.e., optical systems in which refractive elements are combined with a reflective elements) have been proposed for reduction projection-optical systems. Among these have been several that propose the formation of an intermediate image one or more times within the optical system.

Previously proposed reduction projection-optical systems which form only one intermediate image are disclosed in Japanese laid-open patent documents 5-25170 (1993), 63-163319 (1988), 4-234722 (1992), and in U.S. Pat. No. 4,779,966. Among these proposed systems, only those disclosed in Japanese laid-open patent document 4-234722 and U.S. Pat. No. 4,779,966 use just one concave mirror.

Japanese laid-open patent document 4-234722 and U.S. Pat. No. 4,779,966 disclose catadioptric optical projection systems comprising a concave mirror and a double-pass lens group. Incident light propagates through the double-pass lens group in a first direction, strikes the concave mirror, and then propagates, as reflected light, back through the double-pass lens group in a second direction opposite to the first direction. Because the double-pass lens groups of Japanese laid-open patent document 4-234722 and U.S. Pat. No. 4,779,966 use only concave lenses and thus have negative power, the light entering the concave mirror is dispersed, requiring a relatively large-diameter concave mirror.

The double-pass lens group of Japanese laid-open patent document 4-234722 (1992) is completely symmetric, which reduces aberrations to an extreme degree, significantly reducing the aberration correction burden for the downstream refractive optical system. However, the completely symmetric configuration also reduces the distance between the intermediate image and the nearest optical element to such a degree that use of a beam-splitter is necessitated to effectively redirect the reflected light while allowing passage of the incident light.

The optical system disclosed in U.S. Pat. No. 4,779,966 comprises a concave mirror in a second imaging system that images an intermediate image onto the wafer. To provide adequate image brightness in this configuration, divergent light enters the concave mirror, requiring a relatively large-diameter mirror.

In optical systems utilizing several mirrors, it is possible to reduce the number of refractive lenses, but other problems arise.

In order to obtain adequate depth of focus with improved resolution, phase-shift reticles are often used. To most effectively use a phase-shift reticle, the ratio σ between the illuminating optical system NA and the imaging optical system NA should be variable. An aperture stop can be installed in the imaging system to provide or increase this variability. But, in a catadioptric imaging system, as, for example, in U.S. Pat. No. 4,779,966, there is often no location for an effective aperture stop.

In catadioptric optical systems in which a double-pass lens system is employed in a demagnifying portion of the optical system, the demagnification reduces the allowable distance between the reflecting element and the wafer, so that few lenses can be placed in the optical path between the reflective element and the wafer. This necessarily limits the numerical aperture (NA), and thus the maximum brightness, of the optical system. Even if it were possible to realize an optical system with a high NA, many optical elements would have to be placed along a limited optical path length, so that the distance between the wafer and the tip surface of the object lens (i.e., the working distance WD) would be undesirably short.

In conventional catadioptric optical systems, the optical path must be eccentric over at least a portion of its length. The adjustment procedure for the eccentric sections of such optical systems is difficult and makes the realization of precision systems essentially impossible.

The applicant has previously proposed a dual-imaging optical system which is designed with a first imaging system comprising a two-way optical system having a concave mirror and a double-pass lens group that allows light both incident to, and reflected from, the concave mirror to pass through the lens group. An intermediate image is formed by the first imaging system and an image of the intermediate image is formed by a second imaging system. A reflecting surface is provided to direct the light flux from the first imaging system toward the second imaging system.

This dual-imaging optical system allows a smaller diameter concave mirror, and provides an effective aperture-stop placement position, allowing a variable ratio σ based on the illuminating optical system NA and the imaging system NA for use with phase-shift reticles for resolution enhancement. It also allows for sufficient optical system brightness and an optical system where the working distance WD, the distance between the wafer and the nearest surface of the object imaging system, can be relatively long. It also makes the adjustment of the eccentric section of the optical system easy, enabling the practical realization of a precision optical system.

While this dual-imaging optical system has many superior features, attempts to reduce the size of the optical system while maintaining image-forming performance results in increased distortion. That is, the optical system is not symmetric, so even if other aberrations are corrected, distortion will remain.

Also, when trying to correct distortion, astigmatism correction may be affected, and it is well known that it is extremely difficult to correct both types of aberration at the same time.

It is desirable to leave other types of well-corrected aberration as-is, and correct only the distortion or astigmatism aberration, especially the higher-order distortion.

In the manufacturing of high-precision optical systems, variance from product to product inevitably arises due to manufacturing tolerances. This variance results in different aberration levels for each optical system produced. Such manufacturing-error-induced aberrations are normally corrected by adjusting sections of the optical system. However, when there is asymmetric aberration of differing amounts across the image surface due to manufacturing tolerances, or when the generated aberration amounts are too great, it is often impossible to fully correct the system for manufacturing tolerances solely by adjusting sections of the optical system. In this case, corrections can sometimes be made by inserting an aspheric, aberration-correcting plate near the final focused image. While such a correcting plate is effective in correcting "angle-of-view" aberrations (such as distortion and/or astigmatism) when placed as close as possible to the image surface, in practice, the presence of other adjusting devices or measuring equipment near the image surface normally requires that such plates be placed a sufficient distance away from the image surface such that other types of aberration (related to aperture) are also affected. This complicates the correction process.

SUMMARY OF THE INVENTION

This invention provides a dual-imaging optical system that can effectively correct distortion to a high degree while providing a compact optical system, maintaining imaging performance, and correcting for manufacturing tolerances.

The invention comprises a dual-imaging optical system including a first imaging system that forms an intermediate image, and a second imaging system that forms an image of the intermediate image.

A reflecting surface directs light flux from the first imaging system to the second imaging system in this dual-imaging optical system.

A correcting optical system for correcting distortion, astigmatism, and/or accumulated manufacturing tolerances is placed at or near the intermediate image. The correcting optical system includes at least one aspheric surface. The aspheric optical surface may be a lens surface of a lens near the reflecting surface, or the reflecting surface itself may be made aspheric.

The shape of the aspheric optical surface can be axially symmetric. Alternatively, the aspheric optical surface can be a circular or non-circular cylindrical surface. Further alternatively, the surface can be completely asymmetric. Using the symmetric configuration, at least distortion, spherical aberration of the pupil, and accumulated manufacturing tolerances of the optical system can be corrected.

In order to correct distortion or astigmatism, correct accumulated manufacturing tolerances, and not create other types of distortion, a correcting optical system in the form of at least one aspheric optical surface is placed near the intermediate image. The placement of an aspheric correcting optical system near the intermediate image is especially effective for correcting higher-order distortion or astigmatism. A lens with an aspheric surface may be used for this purpose. On the other hand, since the reflecting surface is near the intermediate image, the reflecting surface itself may be made aspheric and used as the correcting optical system. The reflecting surface can be placed very close to or even at the intermediate image, so that making the reflecting-surface aspheric allows designating the desired distortion or astigmatic aberration correction in a straightforward manner, with little effect on other types of aberration.

The aspheric surface is preferably axially symmetric. Alternatively, an aspheric lens surface could be combined with a rectangular reflecting surface shaped so that change occurred only longitudinally in the reflecting surface. For the same sort of effect, the aspheric lens surface can be a circular or non-circular cylindrical (toric) surface. In other words, the effect that the shape of the aspheric surface has on distortion would be primarily dependent upon changes in the longitudinal inclination of the aspheric surface, and changes in the inclination in the shorter direction would not change the image height significantly, so it would not have that great an effect on distortion. A completely asymmetric aspheric surface may also be used as a lens surface or a reflecting surface.

From the point of view of machining the aspheric surface, simplicity is preferred, such that an axially symmetric surface or one which can change in a longitudinal direction only (a circular or non-circular cylindrical surface) would be better.

An axially asymmetric aspheric surface may be produced by performing aspheric surface machining symmetrically around the optical axis. A circular or non-circular cylindrical surface may be reproduced with a single-direction aspheric surface machining device.

When there are different levels of aberration across the image surface due to manufacturing error, a completely asymmetric aberration-correction surface can be used, depending upon the amount of aberration. Naturally, it would be placed close to the intermediate image, so that just the corrections pertaining to the angle of view could be prioritized as necessary.

The above-summarized invention allows near-perfect correction of the particular aberrations which increase with reductions in the size of the optical system, and even near-perfect correction of hard-to-correct higher-order aberration and distortion and aberration due to manufacturing, while avoiding almost all effects on other aberrations, such as spherical aberration, coma aberration, sine conditions, and axial chromatic aberration.

The foregoing and other objects, features, and advantages of the invention will become more apparent from the following detailed description of example embodiments which proceeds with reference to the accompanying drawings.

BRIEF DESCRIPTION OF DRAWINGS

FIGS. 1(a) and 1(b) are plan views, respectively, of the reticle and wafer of FIG. 1(c).

FIGS. 2(a) and 2(b) are plan views, respectively, of the reticle and wafer of FIG. 2(c).

DETAILED DESCRIPTION

Figure 1A:
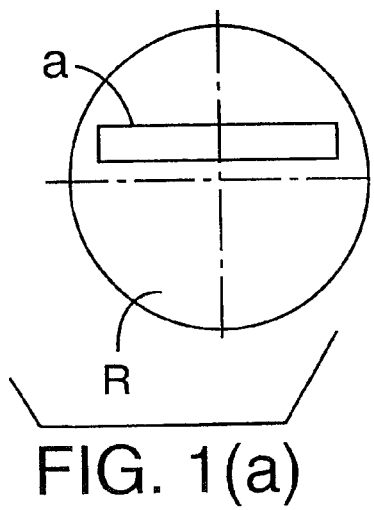
FIGS. 1(a)–1(c) are a schematic diagram of a first representative embodiment of the catadioptric reduction optical system of the present invention.
Figure 1B:
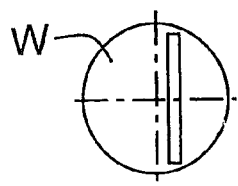
Figure 1C:
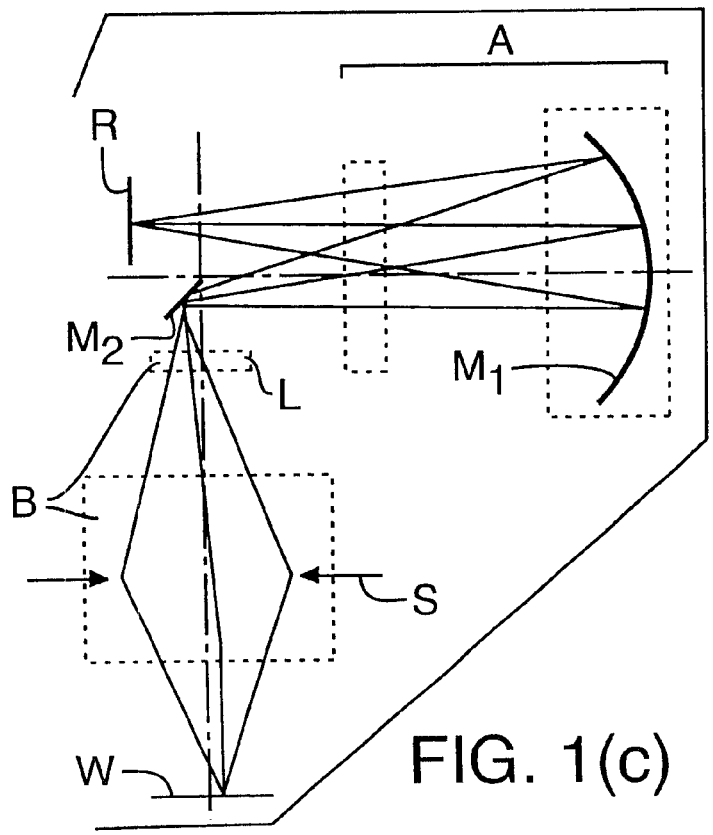

FIGS. 1(a)–1(c) show a first representative embodiment of the invention employed in a projection-optical system wherein a circuit pattern on a reticle R is reduced and transferred onto a semiconductor wafer W. This projection-optical system has a first imaging system A that forms an intermediate image of the pattern defined by the reticle R, a reflecting surface $M_2$ placed close to the intermediate image, and a second imaging system B that forms an image of the intermediate image on the wafer W.

Figure 3:
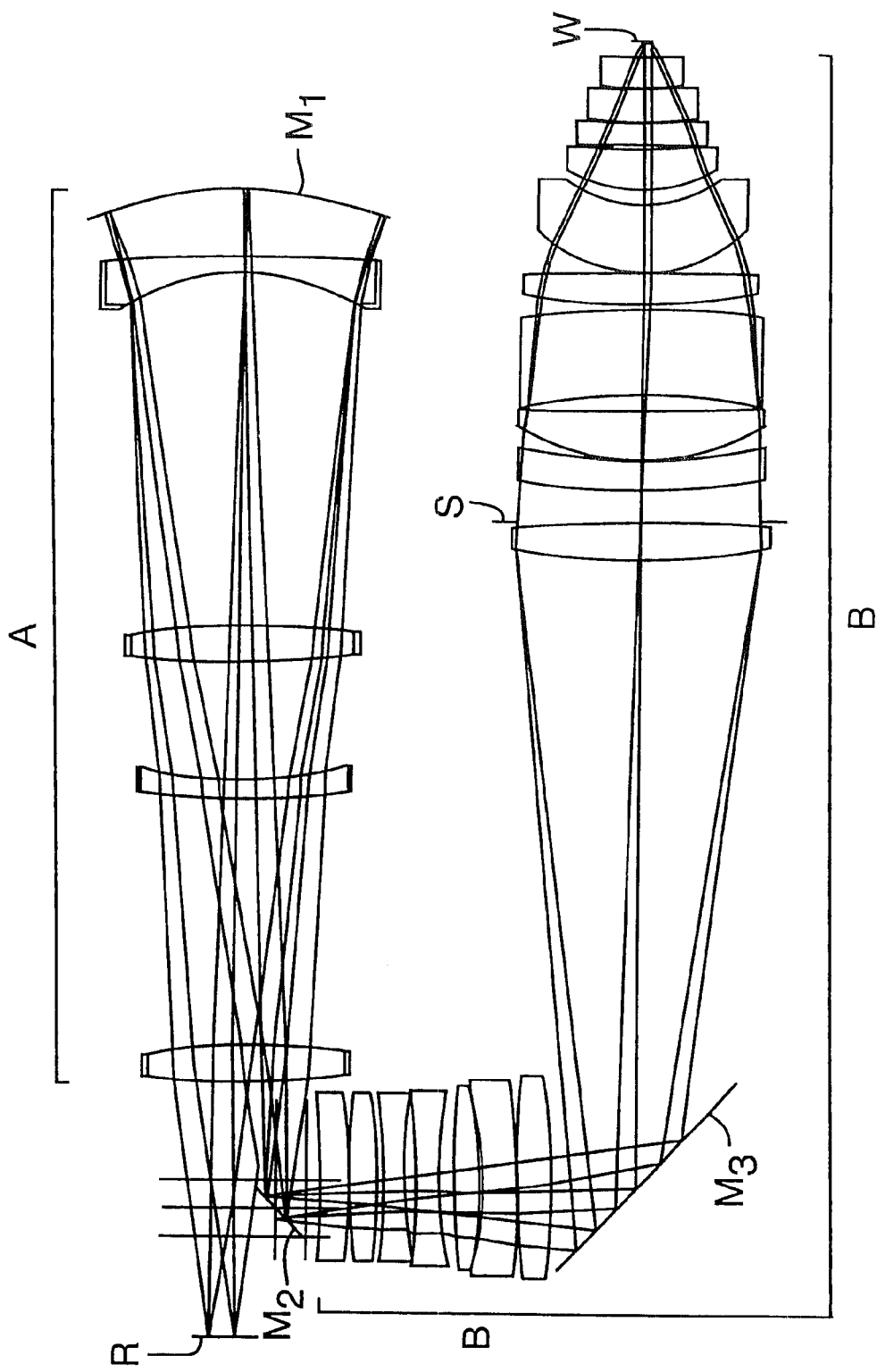
FIG. 3 is an optical diagram of the catadioptric reduction optical system of Example Embodiment 1, employing in imaging system B a lens element having an aspheric surface.
Figure 4:
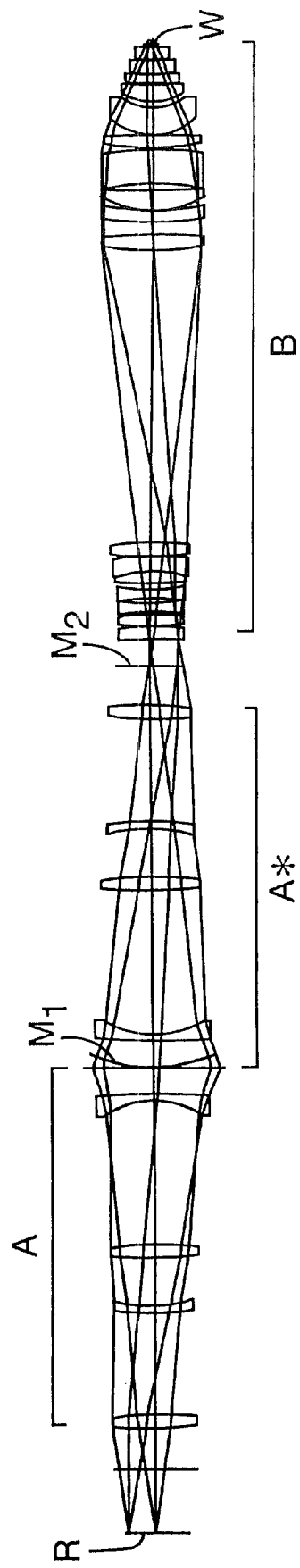
FIG. 4 is an expanded optical path diagram of Example Embodiment 1.
Figure 6:
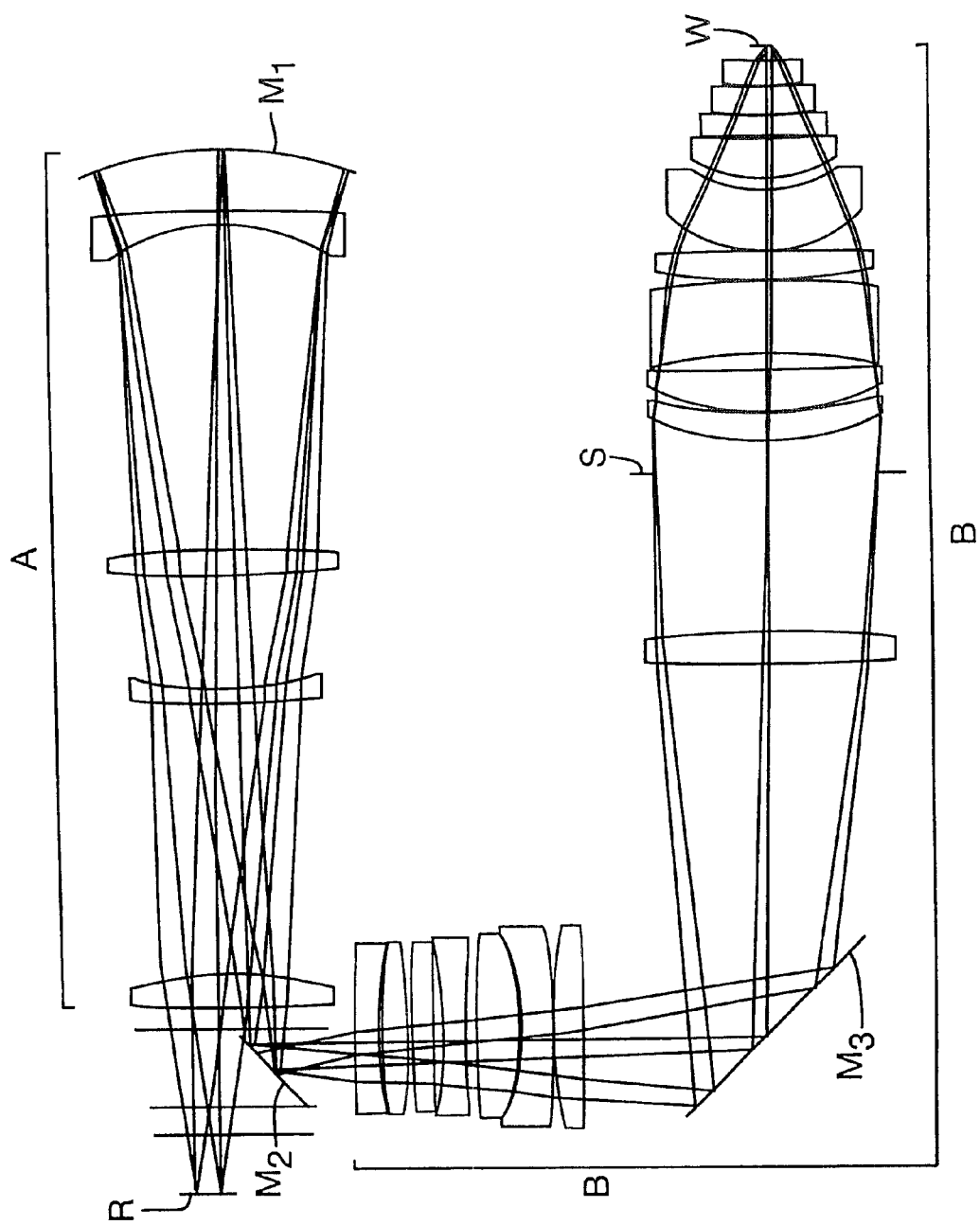
FIG. 6 is an optical diagram of the catadioptric reduction optical system of Example Embodiment 2, in which the reflecting surface $M_2$ is aspheric.

In the Example Embodiments described below, as seen in FIGS. 3, 4, and 6, the first imaging system A preferably comprises four refractive lenses and one concave mirror $M_1$. Light from the reticle R passes through the first imaging system A in both directions. The reflecting surface $M_2$ is placed to direct the light returning from the first imaging system A into the second imaging system B. This reflecting surface $M_2$ may be aspheric.

In the Example Embodiments described below, the second imaging system B preferably comprises 17 refractive lenses. An aperture stop S is placed inside the second imaging system B. Of the lens surfaces in the second imaging system B, the surface closest to the reflecting surface $M_2$ may be aspheric as an alternative to, or in addition to, the reflecting surface $M_2$ being aspheric.

By way of example, the projection-optical system of FIGS. 1(a)–1(c) is a lens system with a magnification ratio of 1/4×, an image-side numerical aperture NA of 0.6, a maximum object height of 72 mm, and a rectangular aperture a. The rectangular aperture corresponds to a rectangular illumination field, with a vertical length of 16 to 40 mm, preferably 24 mm, and a horizontal length of 120 mm. The refractive lenses can be made of fused silica ($SiO_2$) or calcium fluoride ($CaF_2$). At the 193-nm wavelength from an ultraviolet excimer laser, the chromatic axial and magnification aberration is corrected for wavelength widths of ±0.1 nm.

Figure 2B:
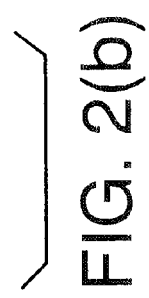
FIGS. 2(a)–2(c) are a schematic diagram of a second representative embodiment of the catadioptric reduction optical system of the present invention.
Figure 2C:
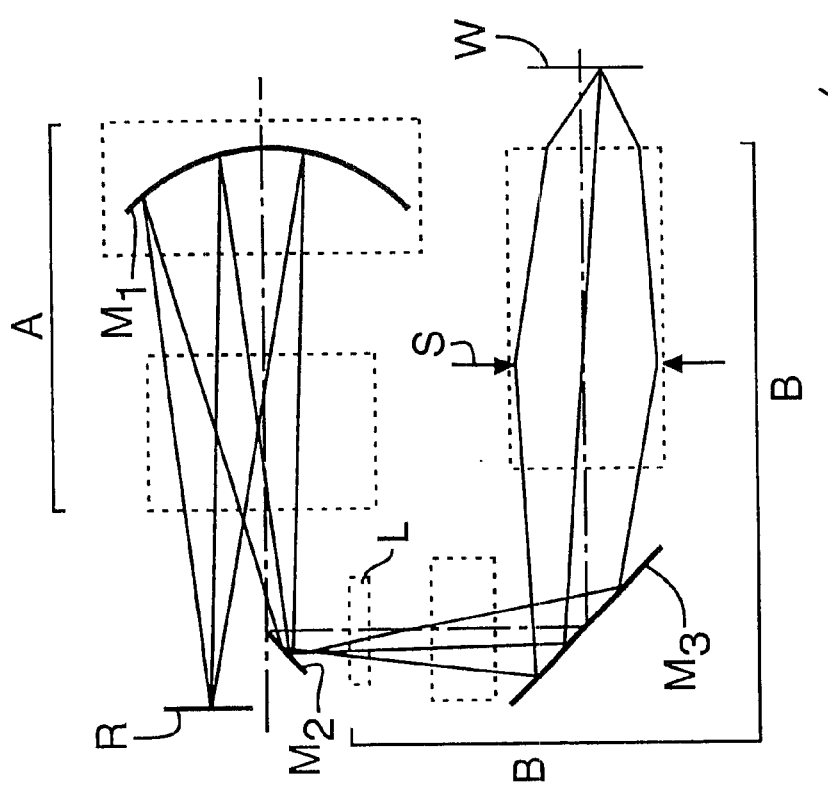
Figure 2A:
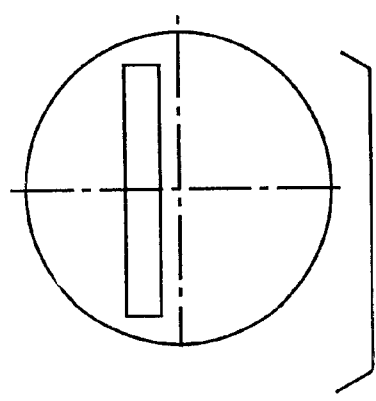

FIGS. 2(a)–2(c) show a schematic diagram of a second representative embodiment, in which a reflecting surface $M_3$ is placed inside the second imaging system B, and the direction of travel of the light illuminating the reticle R is aligned with the direction of travel of the light exposing the wafer W. Other aspects of this embodiment are the same as for the first embodiment, and as such, it has the same imaging performance as the first embodiment.

Example Embodiment 1

FIG. 3 shows an optical path diagram of Example Embodiment 1 of a catadioptric optical system according to the present invention. The optical system of FIG. 3 can be used with the embodiment of FIGS. 1(a)–1(c) or 2(a)–2(c). In FIG. 3, the reflecting surface $M_2$ is planar and the surface of lens element L in the optical system B nearest to the reflecting surface $M_2$ is aspheric.

FIG. 4 shows an expanded optical path diagram of Example Embodiment 1. That is, in order to avoid the complications of reflected light in the drawings, the light rays are shown in FIG. 4 as always propagating in the same direction.

Table 1 below lists the surface data of Example Embodiment 1. The optical path of FIG. 4 is taken in Table 1, with the reflecting surface $M_3$ omitted, and with a flat reflecting surface inserted, as surface 10, to represent the unfolding of the optical path as shown in FIG. 4. In Table 1, the first column lists the surface number from the reticle R, the second column, labeled "r," lists the radius of curvature for each of the surfaces, the third column, labeled "d," lists the axial distance from each surface to the adjacent surface, the fourth column lists the material for each lens, and the fifth column lists the group designation for each optical element. The lens surface featuring an asterisk (*) in the first column is aspheric. An asterisk in column 5 indicates a return path.

The shape of the aspheric surface in Example Embodiment 1 is represented by the following equation, $$S(y) = \frac{\frac{y^2}{r}}{1+\sqrt{1-\frac{Ky^2}{r^2}}} + \sum_{i=2}^{N} C_{2i} y^{2i}$$

wherein y is the height perpendicular to the optical axis, S(y) is the amount of sag parallel to the optical axis at height y, r is the radius of curvature on the optical axis, K is the conic coefficient, and $C_n$ is the nth aspheric surface coefficient. The conic coefficient K and the aspheric surface coefficients for Example Embodiment 1 are shown Table 2 (entitled Example Embodiment 1 Aspheric Surface Data), below.

The refractive index n and the Abbe number ν±0.1 nm of the standard wavelength in relation to the standard wavelength used for fused silica ($SiO_2$) and calcium fluoride ($CaF_2$) are as follows.

$SiO_2$: n=1.56019 ν=1780

$CaF_2$: n=1.50138 ν=2550

Figure 5:
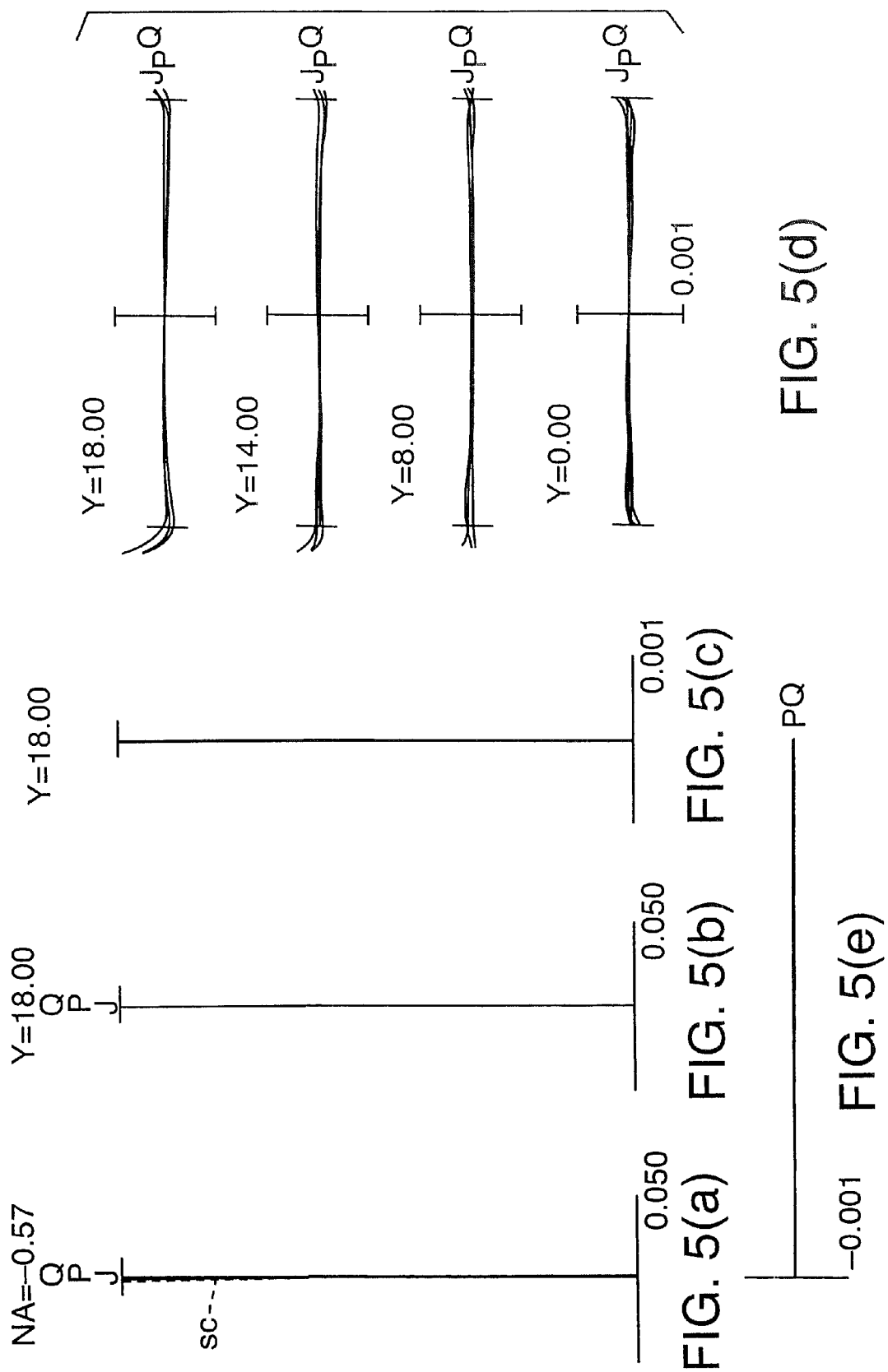
FIGS. 5(a), 5(b), 5(c), 5(d), and 5(e) are, respectively, graphical representations of spherical aberration, astigmatic aberration, distortion, coma, and (chromatic) magnification aberration exhibited by Example Embodiment 1.

FIGS. 5(a), 5(b), 5(c), 5(d), and 5(e) depict representative plots of spherical aberration, astigmatic aberration, distortion, coma, and magnification aberration, respectively, exhibited by Example Embodiment 1. In FIG. 5(a), SC represents deviation from the sine condition. Also, in each of FIGS. 5(a)–5(d), Y is the image height, P is the standard wavelength +0.1 nm, J is the standard wavelength and Q is the standard wavelength −0.1 nm. As is clear from each of FIGS. 5(a)–5(e), spherical aberration, coma, astigmatism, and distortion are all corrected to a very high degree, demonstrating the superior performance of this optical system.

Note that, in this example embodiment, a lens having an aspheric surface was placed immediately after the reflecting surface $M_2$. Alternatively, an aspheric lens surface can be placed immediately in front of the reflecting surface $M_2$. In Table 1, surfaces 1 and 10 are virtual reflecting surfaces.

TABLE 1

Example Embodiment 1 Surface Data

| No. | r | d | Material | Group |
|---|---|---|---|---|
| 0 | — | 160.00000 | | reticle |
| 1 | ∞ | 98.99633 | | |
| 2 | 1140.26480 | 40.00000 | $CaF_2$ | A |
| 3 | −579.11541 | 255.01123 | | |
| 4 | 1182.85550 | 15.00000 | $SiO_2$ | A |
| 5 | 409.99148 | 124.15981 | | |
| 6 | 1269.25390 | 30.00000 | $SiO_2$ | A |
| 7 | −1392.04400 | 366.83229 | | |
| 8 | −269.86608 | 15.00000 | $SiO_2$ | A |
| 9 | −2727.50700 | 70.00000 | | |
| 10 | ∞ | 0 | | |
| 11 | 443.32063 | 70.00000 | | A ($M_1$) (Concave Mirror) |
| 12 | 2727.50730 | 15.00000 | $SiO_2$ | A* |
| 13 | 269.86608 | 366.83229 | | |
| 14 | 1392.04380 | 30.00000 | $SiO_2$ | A* |
| 15 | −1269.25400 | 124.15981 | | |
| 16 | −409.99148 | 15.00000 | $SiO_2$ | |
| 17 | −1182.85600 | 255.01123 | | |
| 18 | 579.11541 | 40.00000 | $CaF_2$ | A* |
| 19 | −1140.26500 | 98.99633 | | |
| 20 | ∞ | 73.73678 | | $M_2$ (Reflecting Surface) |
| *21 | −1617.55100 | 30.00000 | $SiO_2$ | B |
| 22 | −946.74609 | 0.10000 | | |
| 23 | 443.20483 | 30.00000 | $CaF_2$ | B |
| 24 | −613.15563 | 5.00000 | | |
| 25 | −1133.72600 | 24.00000 | $SiO_2$ | B |
| 26 | 624.49548 | 10.94895 | | |
| 27 | −718.16831 | 24.00000 | $SiO_2$ | B |
| 28 | 413.72496 | 14.47012 | | |
| 29 | 568.99448 | 30.00000 | $CaF_2$ | B |
| 30 | −356.83594 | 2.54622 | | |
| 31 | −303.66460 | 35.00000 | $SiO_2$ | B |
| 32 | −748.52031 | 0.10000 | | |
| 33 | 1067.17910 | 35.00000 | $CaF_2$ | B |
| 34 | −916.15492 | 732.19624 | | |
| 35 | 639.63609 | 40.00000 | $SiO_2$ | B |
| 36 | −1837.83000 | 1.00000 | | |
| 37 | — | 32.10226 | | B (Aperture Stop) |
| 38 | 851.14867 | 30.00000 | $SiO_2$ | B |
| 39 | 596.88123 | 1.26000 | | |
| 40 | 256.43786 | 50.00000 | $CaF_2$ | B |
| 41 | 4113.75620 | 18.94853 | | |
| 42 | −477.89543 | 88.37165 | $SiO_2$ | B |
| 43 | −606.10781 | 0.51272 | | |
| 44 | 690.95035 | 32.52509 | $CaF_2$ | B |
| 45 | −3442.72000 | 0.36748 | | |
| 46 | 153.43477 | 69.82314 | $SiO_2$ | |
| 47 | 132.23252 | 14.68969 | | |
| 48 | 145.32257 | 45.19542 | $SiO_2$ | B |
| 49 | 1541.26430 | 4.20000 | | |
| 50 | −1123.78400 | 22.68000 | $SiO_2$ | B |
| 51 | 1762.68930 | 1.91993 | | |
| 52 | 685.77175 | 31.14230 | $SiO_2$ | B |
| 53 | 958.60472 | 2.25212 | | |
| 54 | 399.11389 | 31.27391 | $SiO_2$ | B |
| 55 | 5403.63050 | 15.00000 | | Wafer |

TABLE 2

Example Embodiment 1 Aspheric Surface Data

| Lens Surface Number: 21 | K = 1.0000 |
|---|---|
| $C_4 = -2.38900 \times 10^{-9}$ | $C_6 = -4.71130 \times 10^{-15}$ |
| $C_8 = -2.05220 \times 10^{-19}$ | $C_{10} = 8.36490 \times 10^{-24}$ |

Example Embodiment 2

FIG. 6 shows an optical path diagram of Example Embodiment 2 of a catadioptric optical system according to the present invention. The optical system of FIG. 6 can be used with the embodiment of FIGS. 1(*a*)–1(*c*) or 2(*a*)–2(*c*). In FIG. 6, the reflecting surface $M_2$ is aspheric and the optical surface of lens L in the optical system B nearest to the reflecting surface $M_2$ is spherical.

Table 3 below lists the surface data of Example Embodiment 2. An optical path corresponding to FIG. 1 is taken in Table 3, so that mirror $M_3$ is omitted. As in Table 1, in Table 3, the first column lists the surface number from the reticle R, the second column, labeled "r," lists the radius of curvature for each of the surfaces, the third column, labeled "d," lists the axial distance from each surface to the next surface, the fourth column lists the material for each lens, and the fifth column lists the group designation for each optical element. The surface featuring an asterisk (*) in the first column is aspheric. An asterisk in column 5 indicates a return path. In contrast with Table 1, negative distances are employed in Table 3 to represent the return path of reflected light, rather than negative radii of curvature. In Table 3, surfaces 1–6, 13, and 26–31 are virtual surfaces that were considered as part of the lens-design process.

The shape of the aspheric surface of Example Embodiment 2 may be represented by the equation presented above relative to Example Embodiment 1. The conic coefficient K and the aspheric surface coefficients for Example Embodiment 2 are shown in Table 4, (entitled Example Embodiment 2 Aspheric Surface Data), below.

Figure 7:
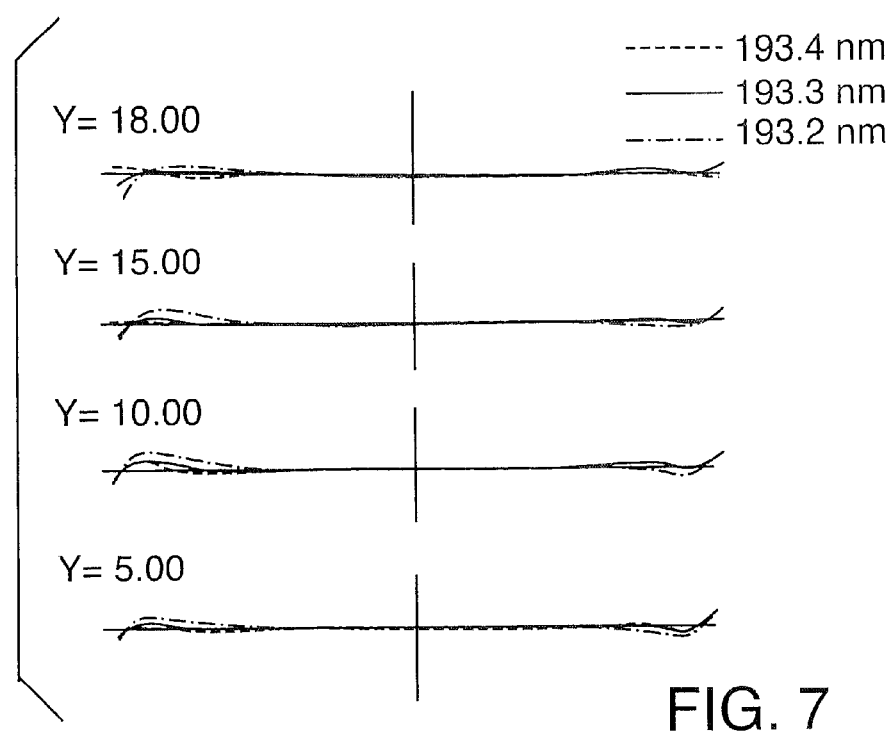
FIG. 7 is a graphical representation of the transverse aberration exhibited by Example Embodiment 2.
Figure 8:
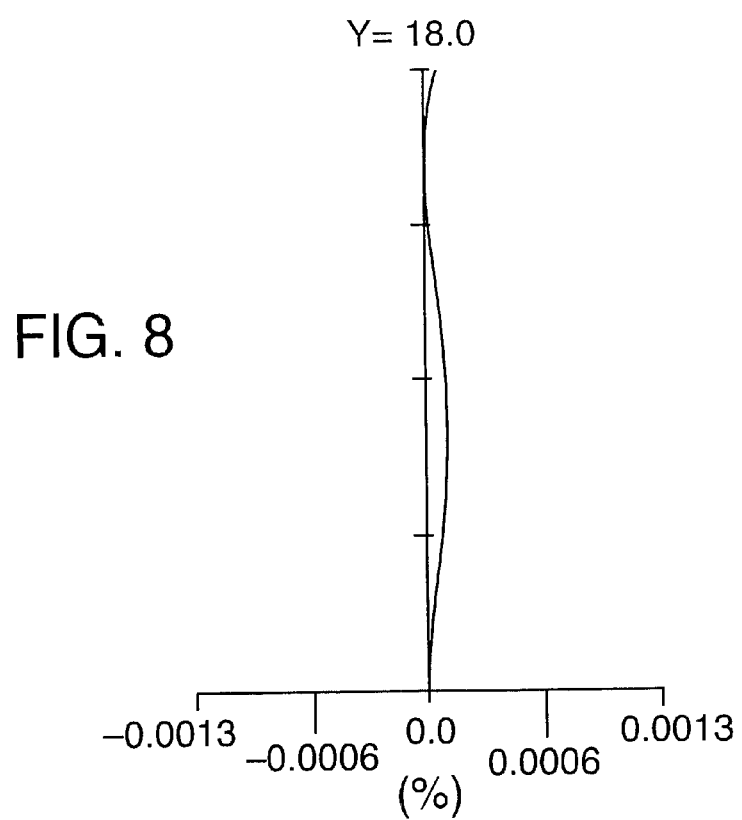
FIG. 8 is a graphical representation of the distortion exhibited by Example Embodiment 2.

FIG. 7 depicts representative plots of coma exhibited by Example Embodiment 2. In each of the diagrams, Y is the image height. As is clear from these aberration diagrams, the optical system of Example Embodiment 2 provides excellent performance, particularly in that coma is corrected nearly to the point of no aberration. FIG. 8 provides plots of distortion exhibited by Example Embodiment 2. As is clear from the distortion curve, distortion correction is extremely good.

TABLE 3

Example Embodiment 2 Surface Data

| No. | r | d | Material | Group |
|---|---|---|---|---|
| 0 | — | 60.000000 | | reticle |
| 1 | ∞ | 0 | | |
| 2 | ∞ | 30.000000 | | |
| 3 | ∞ | 0 | | |
| 4 | ∞ | 80.000000 | | |
| 5 | ∞ | 0 | | |
| 6 | ∞ | 21.110201 | | |
| 7 | 1363.11994 | 36.000000 | $CaF_2$ | A |
| 8 | −404.99434 | 279.630076 | | |
| 9 | 1408.93350 | 13.500000 | $SiO_2$ | A |
| 10 | 376.65770 | 116.466055 | | |
| 11 | 906.81981 | 27.000000 | $SiO_2$ | A |
| 12 | −1332.26491 | 154.962803 | | |
| 13 | ∞ | 175.635036 | | |

TABLE 3-continued

Example Embodiment 2 Surface Data

| No. | r | d | Material | Group |
|---|---|---|---|---|
| 14 | −249.08892 | 13.500000 | $SiO_2$ | A |
| 15 | −3128.27181 | 63.000000 | | |
| 16 | −401.41197 | −63.000000 | | A ($M_1$) (Concave Mirror) |
| 17 | −3128.27181 | −13.500000 | $SiO_2$ | A* |
| 18 | −249.08892 | −175.635036 | | |
| 19 | ∞ | −154.962803 | | |
| 20 | −1332.26491 | −27.000000 | $SiO_2$ | |
| 21 | 906.81981 | −116.466055 | | |
| 22 | 376.65770 | −13.500000 | $SiO_2$ | A* |
| 23 | 1408.93350 | −279.630076 | | |
| 24 | −404.99434 | −36.000000 | $CaF_2$ | A* |
| *25 | 1363.11994 | −21.110201 | | $M_2$ (Reflecting Surface) |
| 26 | ∞ | 0 | | |
| 27 | ∞ | 0 | | |
| 28 | ∞ | 0 | | |
| 29 | ∞ | 0 | | |
| 30 | ∞ | 0 | | |
| 31 | ∞ | 130.000000 | | |
| 32 | 2229.03311 | 24.000000 | $SiO_2$ | B |
| 33 | 408.22661 | 3.000000 | | |
| 34 | 569.14187 | 27.000000 | $CaF_2$ | B |
| 35 | −444.32289 | 4.500000 | | |
| 36 | 1784.92158 | 21.600000 | $SiO_2$ | B |
| 37 | −2577.16606 | 10.722977 | | |
| 38 | −343.44849 | 21.600088 | $SiO_2$ | B |
| 39 | 1202.96387 | 12.859591 | | |
| 40 | 1625.87851 | 47.000000 | $CaF_2$ | B |
| 41 | −195.20517 | 2.412834 | | |
| 42 | −193.18029 | 31.500000 | $SiO_2$ | B |
| 43 | −1287.21632 | 0.100000 | | |
| 44 | 730.56017 | 31.500000 | $CaF_2$ | B |
| 45 | −2127.69381 | 556.238917 | | |
| 46 | 2508.51186 | 36.000000 | $SiO_2$ | B |
| 47 | −1178.02445 | 162.012540 | | |
| 48 | — | 39.867585 | | (Aperture Stop) |
| 49 | 303.62383 | 27.000000 | $SiO_2$ | B |
| 50 | 440.67155 | 1.134000 | | |
| 51 | 249.11054 | 45.000000 | $CaF_2$ | B |
| 52 | 3674.25611 | 17.045914 | | |
| 53 | −543.69897 | 75.048590 | $SiO_2$ | B |
| 54 | −781.60219 | 0.461446 | | |
| 55 | 611.86734 | 29.284957 | $CaF_2$ | B |
| 56 | −4354.55637 | 0.330733 | | |
| 57 | 142.52792 | 62.831346 | $SiO_2$ | B |
| 58 | 128.33358 | 13.206846 | | |
| 59 | 142.57235 | 40.662754 | $SiO_2$ | B |
| 60 | 754.18207 | 3.780000 | | |
| 61 | −1327.11593 | 20.412000 | $SiO_2$ | B |
| 62 | 531.69413 | 1.727935 | | |
| 63 | 375.03771 | 28.020164 | $SiO_2$ | B |
| 64 | 779.50239 | 2.026905 | | |
| 65 | 283.45101 | 25.490979 | $SiO_2$ | B |
| 66 | 4863.26742 | 15.000000 | Wafer | |

Example Embodiment 2 Aspheric Data

Surface Number: 25    K = 1.0000
$C_4 = -0.162401 \times 10^{-10}$    $C_6 = -0.117682 \times 10^{-15}$
$C_8 = -0.123567 \times 10^{-19}$    $C_{10} = 0.274232 \times 10^{-25}$ Having illustrated and demonstrated the principles of the invention in example embodiments, it should be apparent to those skilled in the art that the preferred embodiments can be modified in arrangement and detail without departing from such principles. I claim as the invention all that comes within the scope of the following claims.

What is claimed is:

1. An optical imaging system that forms an image of an object on a surface, the optical imaging system comprising:
   (a) a catadioptric optical system situated and configured to form an intermediate image of the object, wherein the catadioptric optical system includes eight or fewer lens surfaces; and
   (b) a refractive optical system that includes at least one lens of a first material and at least one lens of a second material, the refractive optical system being situated and configured to form an image of the intermediate image on the surface.

2. The optical imaging system of claim 1, wherein the first material is fused silica and the second material is calcium fluorite.

3. The optical imaging system of claim 1, wherein the refractive optical system includes no more than five lenses of the second material.

4. A method of making an exposure apparatus, comprising:
   providing an ultraviolet excimer laser;
   providing a reticle;
   illuminating the reticle with the ultraviolet laser;
   providing a projection optical system as recited in claim 3;
   configuring the projection optical system to form an intermediate image of the reticle; and
   projecting an image of the intermediate image of the reticle on a substrate.

5. The optical imaging system of claim 1, wherein the refractive optical system includes an aperture stop.

6. An exposure apparatus comprising:
   an ultraviolet excimer laser;
   a reticle that is illuminated by the ultraviolet excimer laser; and
   a projection optical system as recited in claim 1, situated and configured to form an intermediate image of a reticle and form an image of the intermediate image on a substrate.

7. A method of making an exposure apparatus, comprising:
   providing an ultraviolet excimer laser;
   providing a reticle;
   situating the ultraviolet laser to illuminate the reticle;
   providing a projection optical system as recited in claim 1;
   providing a substrate; and
   situating the projection optical system to form an intermediate image of the reticle and to image the intermediate image of the reticle onto the substrate.

8. An optical imaging system that forms an image of an object on a surface, the optical imaging system comprising:
   (a) a catadioptric optical system situated and configured to form an intermediate image of the object;
   (b) a refractive optical system that includes at least one lens of a first material and at least one lens of a second material, the refractive optical system being situated and configured to form an image of the intermediate image on the surface; and
   a reflective surface situated and configured to direct a light flux from the catadioptric optical system to the refractive optical system.

9. The optical imaging system of claim 8, wherein the reflective surface is a corrective aspheric optical surface.

10. The optical imaging system of claim 8, wherein the catadioptric optical system includes at most two positive lenses and two negative lenses.

11. An optical imaging system, comprising:
(a) a catadioptric optical system situated and configured to receive a light flux from an object and to form an intermediate image of the object, the catadioptric system including:
 (i) a concave mirror, and
 (ii) no more than eight lens surfaces, wherein two of the no more than eight lens surfaces form a first convex lens;
(b) the first convex lens being situated so that the catadioptric optical system receives a light flux from the object at the first convex lens and so that the light flux from the object propagates through the convex lens to the concave mirror and is reflected by the concave mirror back through the first convex lens;
(c) a refractive optical system including at least one lens of a first material and at least one lens of a second material, the refractive optical system being situated and configured to form an image of the intermediate image on a surface; and
(d) a reflective surface situated and configured to direct the light flux from the catadioptric optical system to the refractive optical system.

12. The imaging system of claim 11, wherein the reflective surface is an aspheric surface.

13. The imaging system of claim 11, wherein the first material is fused silica and the second material is calcium fluorite.

14. The imaging system of claim 13, wherein the catadioptric optical system includes no more than two positive lenses and no more than two negative lenses.

15. The imaging system of claim 11, wherein the refractive optical system includes no more than five lenses of the second material.

16. The imaging system of claim 11, wherein the refractive lens system includes an aperture stop.

17. The imaging system of claim 11, wherein the first convex lens of the catadioptric optical system is situated proximate the intermediate image formed by the catadioptric optical system.

18. An exposure apparatus comprising:
an ultraviolet excimer laser;
a reticle;
a projection optical system as recited in claim 11; and
a substrate;
wherein the reticle is illuminated by the ultraviolet excimer laser and the projection optical system forms an image of the reticle on the substrate.

19. A method of making an optical imaging system, the method comprising:
(a) providing a catadioptric optical system that includes eight or fewer lens surfaces and at least one mirror;
(b) situating the catadioptric optical system to form an intermediate image of an object;
(c) providing a refractive optical system that includes lenses made of a first material and lenses made of a second material; and
(d) situating the refractive optical system to form an image of the intermediate image on a surface.

20. The method of claim 19, further comprising providing a reflective surface situated to direct a light flux from the catadioptric optical system to the refractive optical system.

21. The method of claim 20, wherein the reflective surface is a corrective aspheric surface.

22. The method of claim 19, wherein the first material is fused silica and the second material is calcium fluorite.

23. The method of claim 19, wherein the refractive optical system includes at most five lenses of the second material.

24. The method of claim 19, the catadioptric optical system includes at most two positive lenses and two negative lenses.

25. The method of claim 19, wherein refractive lens system includes an aperture stop.

26. A method for making an optical imaging system that forms an image of an object on a surface, the method comprising:
(a) providing a catadioptric optical system that includes a concave mirror and eight or fewer lens surfaces, wherein at least one of the eight or fewer lens surfaces is a surface of a first convex lens;
(b) situating and configuring the catadioptric optical system so that a light flux from the object is received directly by the first convex lens, directed to the concave mirror, and reflected by the concave mirror back to the first convex lens so that an intermediate image of an object is formed;
(c) situating and configuring a reflective surface to receive and reflect the light flux reflected by the concave mirror to the first convex lens;
(d) situating a refractive optical system to receive the light flux reflected by the reflective surface, the refractive optical system including lenses made of a first material and lenses made of a second material; and
(e) configuring the refractive optical system to form an image of the intermediate image on the surface.

27. The method of claim 26, further comprising specifying an aspheric surface for the reflective surface.

28. The method of claim 27, wherein the refractive optical system includes at most five lenses of the second material.

29. The method of claim 27, wherein refractive optical system includes an aperture stop.

30. The method of claim 27, wherein a light flux from the object enters a convex lens adjacent to the object of the catadioptric system directly.

31. The method of claim 26, further comprising specifying fused silica as the first material and calcium fluorite as the second material.

32. The method of claim 31, wherein the catadioptric optical system is configured to include at most two positive lenses and at most two negative lenses.

* * * * *

UNITED STATES PATENT AND TRADEMARK OFFICE
CERTIFICATE OF CORRECTION

PATENT NO. : 6,392,822 B1
DATED : May 21, 2002
INVENTOR(S) : Tomowaki Takahashi

It is certified that error appears in the above-identified patent and that said Letters Patent is hereby corrected as shown below:

Column 7,
Line 27, No. 16, Group, should read -- A* --.
Line 57, No. 46, Group, should read -- B --.

Column 9,
Line 13, No. 20, Group, should read -- A* --.
Line 29, No. 38, "21.600088" should read -- 21.600000 --.
Line 55, should read -- Table 4 --.

Signed and Sealed this

Twenty-sixth Day of July, 2005

JON W. DUDAS
*Director of the United States Patent and Trademark Office*